United States Patent
Lee

(10) Patent No.: US 7,608,517 B2
(45) Date of Patent: Oct. 27, 2009

(54) METHOD FOR FORMING CAPACITOR OF SEMICONDUCTOR DEVICE

(75) Inventor: Kee Jeung Lee, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 430 days.

(21) Appl. No.: 11/122,298

(22) Filed: May 4, 2005

(65) Prior Publication Data

US 2006/0115953 A1    Jun. 1, 2006

(30) Foreign Application Priority Data

Nov. 29, 2004   (KR) ...................... 10-2004-0098500

(51) Int. Cl.
*H01L 21/285* (2006.01)
(52) U.S. Cl. .................. 438/396; 438/253; 438/785; 257/306; 257/E21.647
(58) Field of Classification Search ................. 438/396, 438/253, 785; 257/306, E21.647
See application file for complete search history.

(56) References Cited

U.S. PATENT DOCUMENTS

| | | | | | |
|---|---|---|---|---|---|
| 4,927,670 | A | * | 5/1990 | Erbil | 505/447 |
| 6,093,944 | A | * | 7/2000 | VanDover | 257/310 |
| 6,251,720 | B1 | * | 6/2001 | Thakur et al. | 438/240 |
| 6,790,791 | B2 | * | 9/2004 | Ahn et al. | 438/783 |
| 2003/0100162 | A1 | * | 5/2003 | Joo | 438/396 |
| 2004/0009679 | A1 | * | 1/2004 | Yeo et al. | 438/785 |
| 2004/0043541 | A1 | * | 3/2004 | Ahn et al. | 438/128 |
| 2005/0130326 | A1 | * | 6/2005 | Lee et al. | 438/3 |

FOREIGN PATENT DOCUMENTS

EP            1192985 A1 *   4/2002

* cited by examiner

*Primary Examiner*—Steven J Fulk
(74) *Attorney, Agent, or Firm*—Ladas & Parry LLP

(57) ABSTRACT

Disclosed is a method for forming a capacitor of a semiconductor device, which can secure wanted charging capacity and also improve leakage current characteristics. The method comprises the steps of: forming a storage electrode on a semiconductor substrate; forming a dielectric layer formed of $Ti_{(1-x)}Tb_xO$ on the storage electrode; and forming a plate electrode on the dielectric layer formed of $Ti_{(1-x)}Tb_xO$.

16 Claims, 3 Drawing Sheets

METHOD FOR FORMING CAPACITOR OF SEMICONDUCTOR DEVICE

BACKGROUND OF THE INVENTION

1. Field of the Invention

The present invention relates to a method for forming a capacitor of a semiconductor device, and more particularly to a method for forming a capacitor of a semiconductor device, which can sufficiently secure necessary charging capacity and also improve current leakage prevention characteristics.

2. Description of the Prior Art

Recently, as the high integration of a memory product accelerates due to the development of the semiconductor process technology, the unit cell area decreases and the operation voltage lowers. However, in spite of the decrease of the cell area, there has been continuous demands for a memory device having a sufficiently high charging capacity of at least 25 fF per cell for the operation thereof, in order to prevent the generation of soft error and the reduction of refresh time.

Therefore, in case of a NO (Nitride Oxide) capacitor for DRAM which employs a dielectric body formed of an $Si_3N_4$ dielectric layer deposited by using DCS (Di-Chloro-Silane) gas, a charge storage electrode of three dimensional shape which has an electrode surface of semi-spherical shape having a wide surface area is used, and the height thereof continuously increases in order to secure a sufficient capacity.

On the other hand, the NO capacitor shows a limit in securing a charging capacitance of over 256 M needed for a next-generation DRAM product. Therefore, as shown in FIG. 1, capacitors employing a single dielectric layer 5 made from a high dielectric material such as $Ta_2O_5$ ($\in$=25), $Al_2O_3$ ($\in$=9), and $HfO_2$ ($\in$=20) have been actively developed in order to secure a sufficient capacity. Recently, capacitors using an $La_2O_3$ ($\in$=27) dielectric layer are also being developed.

In FIG. 1, the reference numeral 1 represents a semiconductor substrate, 2, an isolation interlayer, 3, a storage node contact, 4, a storage electrode, and 5, a plate node.

However, since the dielectric constant of an $Al_2O_3$ dielectric layer is not very large, there is a limit in securing the charge capacitance by the $Al_2O_3$ dielectric layer. In $HfO_2$ and $La_2O_3$ dielectric layers whose dielectric constant are larger than that of the $Al_2O_3$ dielectric layer, if the equivalent $SiO_2$ thickness of the capacitor is lowered to about 15 Å, the leakage current rapidly increases and the yield electric field strength dramatically lowers. As a result, the layers are vulnerable to repetitive electric impacts and the endurance of the capacitor deteriorates.

SUMMARY OF THE INVENTION

Accordingly, the present invention has been made to solve the above-mentioned problems occurring in the prior art, and an object of the present invention is to provide a method for forming a capacitor of a semiconductor device, which can secure necessary charging capacity and also improve current leakage prevention characteristics.

In order to accomplish the object, according to the present invention, there is provided a method for forming a capacitor of a semiconductor device, which includes the steps of: forming a storage electrode on a semiconductor substrate; forming a dielectric layer formed of $Ti_{(1-x)}Tb_xO$ on the storage electrode; and forming a plate electrode on the dielectric layer formed of $Ti_{(1-x)}Tb_xO$.

Here, the storage electrode is formed by using a metal selected from the group consisting of doped poly-silicon (poly-Si), TiN, TaN, W, WN, WSi, Ru, $RuO_2$, Ir, $IrO_2$, and Pt.

A washing process is performed between the steps forming the dielectric electrode and the plate electrode.

The washing process is performed by using an HF mixed solution including $H_2O$ and HF with a ratio of 10 to 100 for $H_2O$/HF or including $NH_4F$ and HF with a ratio of 5 to 500 for $NH_4F$/HF in order to remove a native oxide layer.

After HF washing process, an additional washing process is performed by using $NH_4OH$ mixed solution ($NH_4OH$+ $H_2O_2$+$H_2O$) or $H_2SO_4$ mixed solution ($H_2SO_4$+$H_2O$, $H_2SO_4$+$H_2O$).

Annealing is performed in an NH3 atmosphere to nitrify a surface of the storage electrode.

The annealing is performed in a mixed gas of $O_2$ and $N_2$ mixed at a ratio less than 0.1 for $O_2/N_2$ at a temperature of 500 to 900° C. within a furnace under atmospheric pressure or vacuumed pressure with a flow rate of 1 to 10 slm or through a rapid heat-processing process.

The dielectric layer uses $Ti(OCH(CH_3)_2)_4$ which is a source gas having a Ti component or an organic metallic composition containing Ti is used as a precursor, and one selected from the group consisting of $O_3$, $O_2$, plasma $O_2$, $N_2O$, and plasma $N_2O$ or $H_2O$ of a density of 200±20 g/m$^3$ is used as the reaction gas.

The reaction gas flows at a rate of 0.1 to 1 slm.

The dielectric layer uses $Tb(OC_2H_5)_3$ which is a source gas having a Tb component or an organic metallic composition containing Tb such as $Tb(CH_3)_3$ is used as a precursor, and one selected from the group consisting of $O_3$, $O_2$, plasma $O_2$, $N_2O$, and plasma $N_2O$ or $H_2O$ of a density of 200±20 g/m is used as the reaction gas.

The source gas flows at a rate of 50 to 500 sccm, and the reaction gas flows at a rate of 0.1 to 1 slm.

The dielectric layer contains Tb of 3 to 15%.

The plate electrode is formed by using a metal selected from the group consisting of doped poly-silicon (poly-Si), TiN, TaN, W, WN, WSi, Ru, $RuO_2$, Ir, $IrO_2$, Pt, etc.

In case that a metallic material is used as the material of the plate, a silicon nitride layer or a doped poly-silicon layer having the thickness of 200 to 100 Å is formed on an upper portion of the plate electrode as an absorbing layer or a protecting layer.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, the present invention will be described with reference to accompanying drawings.

Figure 1:
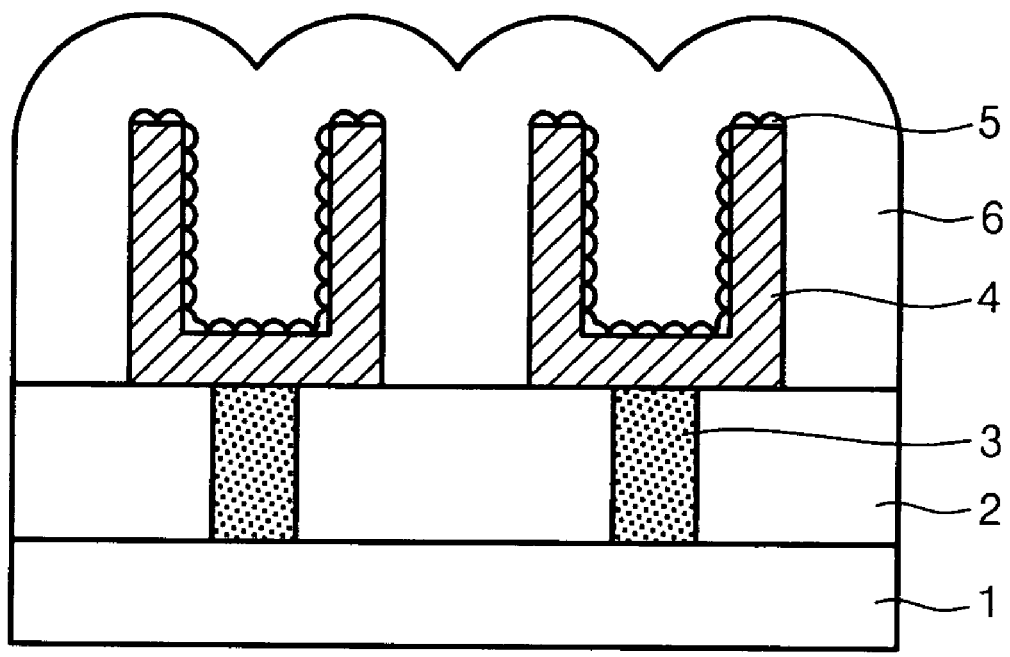
FIG. 1 is a cross-sectional view of a capacitor for explaining a problem in a conventional method for forming a capacitor of a semiconductor device.
Figure 2A:
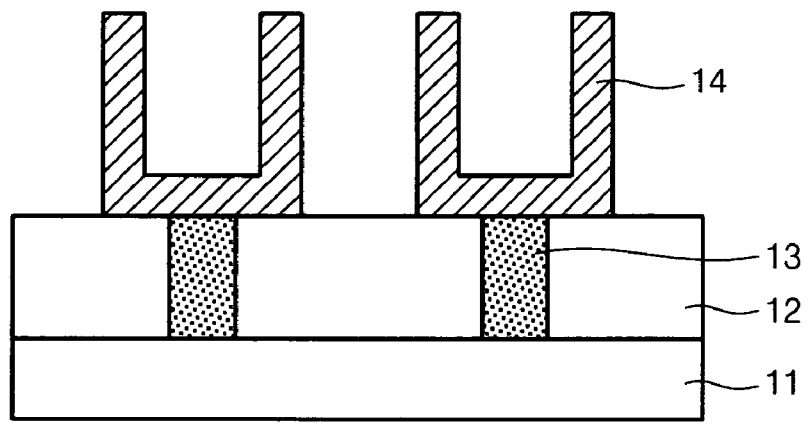
FIGS. 2A to 2C are cross-sectional views of a capacitor for explaining a method for forming a capacitor of a semiconductor device according to a preferred embodiment of the present invention.
Figure 2B:
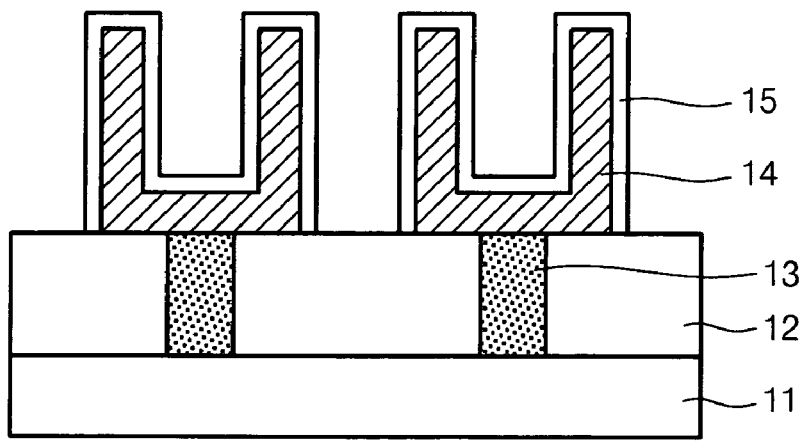
Figure 2C:
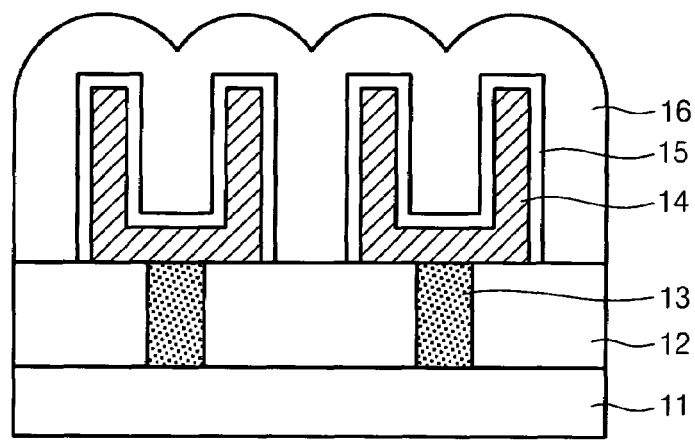

FIGS. 2A to 2C are cross-sectional views of a capacitor for explaining a method for forming a capacitor of a semiconductor device according to a preferred embodiment of the present invention.

As shown in FIG. 2A, an isolation interlayer 12 is formed on an entire upper surface of the semiconductor substrate 11 on which a predetermined lower pattern (not shown) including a transistor and a bitline is formed, so that the isolation interlayer 12 covers the lower patterns. Then, the isolation interlayer 12 is etched to form a contact hole exposing a substrate bonding area or a landing plug poly, and a conductive layer is then filled in the contact hole to form a contact plug, i.e., a storage0 node contact 13. Thereafter, doped poly-silicon (poly-Si) or a metallic material such as TiN, TaN, W, WN, WSi, Ru, $RuO_2$, Ir, $IrO_2$ or Pt is deposited on the isolation interlayer 12 and is then patterned, so that a storage electrode 14 connected to the storage node contact 13 is formed on the isolation interlayer 12.

Here, although FIG. 2A shows a storage electrode 14 having a cylindrical structure, the storage electrode 14 may have a simple plate structure or a concave structure. Further, in case that the storage electrode 10 is formed of the doped poly-silicon, HSG (Hemi-Spherical Grain) may be formed on the surface thereof in order to secure a larger charging capacitance.

As shown in FIG. 2B, before the dielectric layer is formed, the native oxide layer on the storage electrode is removed and a washing process is performed for hydrogen terminate simultaneously. Then, in case that the storage electrode 14 is deposited with the doped poly-silicon, the surfaces of the storage electrode 14 and the isolation interlayer 12 are washed with an HF mixed solution with a mixing ratio, $H_2O$/HF of 10 to 100 or $NH_4F$/HF of 5 to 500.

When it is necessary to remove inorganic or organic particles and other foreign substances on the storage electrode, an additional washing process is performed by using $NH_4OH$ mixed solution ($NH_4OH + H_2O_2 + H_2O$) or $H_2SO_4$ mixed solution ($H_2SO_4 + H_2O_2$, $H_2SO_4 + H_2O$) after the HF washing process.

Thereafter, the dielectric layer 15 is formed of $Ti_{(1-x)}Tb_xO$ $Ti_{(1-x)}Tb_xO$ ($0.03 \leq x \leq 0.3$) on the isolation interlayer 12 including the storage electrode 10 according to atomic layer deposition (hereinafter, referred to as ALD), pulsed chemical vapor deposition (hereinafter, referred to as pulsed CVD), and low pressure chemical vapor deposition (hereinafter, referred to as LP CVD).

Then, when forming the dielectric layer 15, Ti(OCH$(CH_3)_2)_4$ which is a source gas having a Ti component or an organic metallic composition containing Ti is used as a precursor, and one selected from the group consisting of $O_3$, $O_2$, plasma $O_2$, $N_2O$, and plasma $N_2O$ or $H_2O$ of a density of $200\pm20$ g/m$^3$ is used as the reaction gas. Here, the reaction gas flows at a rate of 0.1 to 1 slm (standard liters per minute).

Further, when forming the dielectric layer 15, $Tb(OC_2H_5)_3$ which is a source gas having Tb components or an organic metallic composition containing Tb such as $Tb(CH_3)_3$ is used as a precursor, and one selected from the group consisting of $O_3$, $O_2$, plasma $O_2$, $N_2O$, and plasma $N_2O$ or $H_2O$ of a density of $200\pm20$ g/m$^3$ is used as the reaction gas. Here, the source gas flows at a rate of 50 to 500 sccm, and the reaction gas flows at a rate of 0.1 to 1 slm.

As shown in FIG. 2C, a plate electrode 16 which uses one selected from the group consisting of doped silicon, TiN, TaN, W, WN, WSi, Ru, $RuO_2$, Ir, $IrO_2$, Pt, etc. is formed on the dielectric layer 15 formed of $Ti_{(1-x)}Tb_xO$ to form a capacitor to which $Ti_{(1-x)}Tb_xO$ dielectric layer according to the present invention is applied.

Here, in case that a metallic material is used as the material of the plate 16, a silicon nitride layer (SiN) or a doped poly-silicon layer having a thickness of 200 to 100 Å is formed on the upper portion of the plate electrode as an absorbing layer or a protecting layer to secure the structural safety from humidity, temperature, or electrical impact.

According to the present invention, it is preferred that, in the case that the doped poly-silicon layer is applied as the material of the storage electrode 14 or the plate electrode 16, a diffusion preventing layer of $SiN_x$ is formed on the surface of the storage electrode before forming the $Ti_{(1-x)}Tb_xO$ dielectric layer and on the surface of the $Ti_{(1-x)}Tb_xO$ dielectric layer lest silicon or dopants should be penetrated towards the $Ti_{(1-x)}Tb_xO$ dielectric layer. Here, in order to form the diffusion preventing layer of $SiN_x$, annealing is performed in an NH3 atmosphere, and the surface of the storage electrode and the surface of the $Ti_{(1-x)}Tb_xO$ dielectric layer are nitrified; The annealing is performed in mixed gas of $O_2$ and $N_2$ mixed at a ratio less than 0.1 for $O_2/N_2$ at a temperature of 500 to 900° C. within a furnace under atmospheric pressure or vacuumed pressure with a flow rate of 1 to 10 slm or through a rapid heat-processing process.

Figure 3:
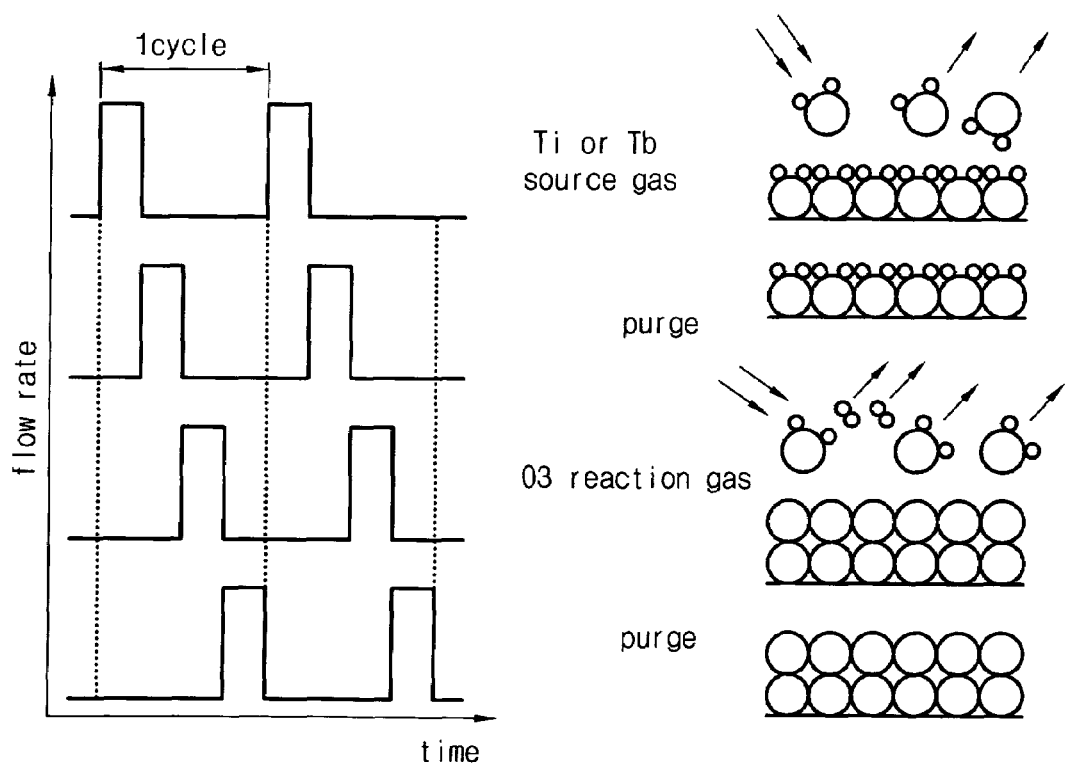
FIG. 3 is a view for showing formation of a dielectric layer following an ALD or pulsed CVD process according to a preferred embodiment of the present invention.

FIG. 3 is a view for showing a dielectric layer forming process according to an ALD or pulsed CVD process according to a preferred embodiment of the present invention.

As shown in FIG. 3, the $Ti_{(1-x)}Tb_xO$ dielectric layer is formed by sequentially processing the steps of flowing of source gas (Ti or Tb), purging, flowing of reaction gas ($O_3$), and purging and repetitively performing the sequential processes until a wanted thickness is obtained. Then, the $Ti_{(1-x)}Tb_xO$ dielectric layer is formed with the formation rate of $TiO_2$ to $Tb_xO_y$ being nine to one. Further, the $Ti_{(1-x)}Tb_xO$ dielectric layer can be formed by sequentially processing the steps of flowing of source gas (Ti), purging, flowing of source gas (Tb), purging, flowing of reaction gas ($O_3$), and purging and repetitively performing the sequential processes until a wanted thickness is obtained. Then, the $Ti_{(1-x)}Tb_xO$ dielectric layer having a mixed phase is formed by first forming a amorphous dielectric layer of under 100 Å while regulating the number of times of the injections of the Tb source gas with the formation rate of $TiO_2$ to TbxOy being under seven to three and then by performing annealing at a temperature of 500 to 800° C.

In forming the dielectric layer according to the LP CVD process, Ti and Tb are injected through a flow rate regulating device respectively, through evaporators or evaporating tubes maintained at a constant temperature with the ratio of Ti to Tb being under 7:3. Then, the source gas of the Ti component and the source gas of the Tb component are injected respectively into a chamber of 250 to 500 degrees Celsius to form the $Ti_{(1-x)}Tb_xO$ dielectric layer of under 100 Å.

As is mentioned above, according to the present invention, by forming the $Ti_{(1-x)}Tb_xO$ dielectric layer on the storage electrode of doped silicon or a metallic material, the charging capacitance needed in a DRAM product of under 100 nm is secured and the leakage current and yield voltage characteristics are controlled so as to have a level of mass-production of under 0.5 fA and over 7 MV/cm, and thereby the endurance and the electrical efficiency of the capacitor can improve simultaneously.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for forming a capacitor of a semiconductor device, which comprises the steps of:
   forming a storage electrode on a semiconductor substrate;
   forming a dielectric layer formed of $Ti_{(1-x)}Tb_xO$ on the storage electrode;
   forming a plate electrode on the dielectric layer formed of $Ti_{(1-x)}Tb_xO$; and
   wherein the dielectric layer of $Ti_{(1-x)}Tb_xO$ is formed through one of pulsed chemical vapor deposition and low pressure chemical vapor deposition using an organic metallic composition containing Ti as a precursor and using an organic metallic composition containing Tb as a precursor, wherein the organic metallic composition containing Ti and the organic metallic composition containing Tb are each used as precursors during the same pulsed chemical vapor deposition or low pressure chemical vapor deposition process, and
   wherein the dielectric layer formed of $Ti_{(1-x)}Tb_xO$ is formed to have a mixed phase.

2. A method according to claim 1, wherein the storage electrode is formed by using a metal selected from the group consisting of doped poly-silicon (poly-Si), TiN, TaN, W, WN, WSi, Ru, $RuO_2$, Ir, $IrO_2$, and Pt.

3. A method according to claim 2, wherein the storage electrode is formed using doped poly-silicon, and a hemispherical grain is formed on a surface of the storage electrode.

4. A method according to claim 1, wherein a washing process is performed between the steps forming the storage electrode and the dielectric layer.

5. A method according to claim 4, wherein the washing process is performed by using an HF mixed solution including $H_2O$ and HF with a ratio of 10 to 100 for $H_2O/HF$ or including $NH_4F$ and HF with a ratio of 5 to 500 for $NH_4F/HF$ in order to remove a native oxide layer.

6. A method according to claim 4, wherein, after HF washing process, an additional washing process is performed by using $NH_4OH$ mixed solution ($NH_4OH+H_2O_2+H_2O$) or $H_2SO_4$ mixed solution ($H_2SO_4+H_2O_2$, $H_2SO_4+H_2O$).

7. A method according to claim 3, wherein annealing is performed in an NH3 atmosphere to nitrify a surface of the storage electrode, and wherein annealing is performed in an NH3 atmosphere to nitrify a surface of the dielectric layer.

8. A method according to claim 7, wherein the annealing is performed in a mixed gas of $O_2$ and $N_2$ mixed at a ratio less than 0.1 for $O_2/N_2$ at a temperature of 500 to 900° C. within a furnace under atmospheric pressure or vacuumed pressure with a flow rate of 1 to 10 slm or through a rapid heat-processing process.

9. A method according to claim 1, wherein the dielectric layer uses $Ti(OCH(CH_3)_2)_4$ which is a source gas having a Ti component as a precursor, and one selected from the group consisting of $O_3$, $O_2$, plasma $O_2$, $N_2O$, and plasma $N_2O$ or $H_2O$ of a density of $200\pm20$ $g/m^3$ is used as the reaction gas in order to form the $Ti_{(1-x)}Tb_xO$ dielectric layer.

10. A method according to claim 9, wherein the reaction gas flows at a rate of 0.1 to 1 slm.

11. A method according to claim 1, wherein the dielectric layer uses $Tb(OC_2H_5)_3$ which is a source gas having a Tb component is used as a precursor, and one selected from the group consisting of $O_3$, $O_2$, plasma $O_2$, $N_2O$, and plasma $N_2O$ or $H_2O$ of a density of $200\pm20$ $g/m^3$ is used as the reaction gas in order to form the $Ti_{(1-x)}Tb_xO$ dielectric layer.

12. A method according to claim 11, wherein the source gas flows at a rate of 50 to 500 sccm, and the reaction gas flows at a rate of 0.1 to 1 slm.

13. A method according to claim 1, wherein the dielectric layer contains Tb of 3 to 15%.

14. A method according to claim 1, wherein the plate electrode is formed by using a metal selected from the group consisting of doped poly-silicon (poly-Si), TiN, TaN, W, WN, WSi, Ru, $RuO_2$, Ir, $IrO_2$, and Pt.

15. A method according to claim 1, wherein, in case that a metallic material is used as the material of the plate, a silicon nitride layer or a doped poly-silicon layer having a thickness of 200 to 100 Å is formed on an upper portion of the plate electrode as an absorbing layer or a protecting layer.

16. A method according to claim 1, wherein the dielectric layer of $Ti_{(1-x)}Tb_xO$ is formed using $Ti(OCH(CH_3)_2)_4$ which is a source gas having a Ti component as a precursor, $Tb(OC_2H_5)_3$ which is a source gas having a Tb component is used as a precursor, and one selected from the group consisting of $O_3$, $O_2$, plasma $O_2$, $N_2O$, and plasma $N_2O$ or $H_2O$ of a density of $200\pm20$ $g/m^3$ as the reaction gas.

* * * * *